(12) United States Patent
Hirota (10) Patent No.: US 8,243,531 B2
(45) Date of Patent: Aug. 14, 2012

(54) REFERENCE POTENTIAL GENERATING CIRCUIT OF SEMICONDUCTOR MEMORY

(75) Inventor: Akihiro Hirota, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 246 days.

(21) Appl. No.: 12/730,362

(22) Filed: Mar. 24, 2010

(65) Prior Publication Data

US 2010/0246283 A1  Sep. 30, 2010

(30) Foreign Application Priority Data

Mar. 26, 2009  (JP) ................................. 2009-076404

(51) Int. Cl.
*G11C 7/00* (2006.01)
*G11C 7/04* (2006.01)
*G11C 5/14* (2006.01)
(52) U.S. Cl. .................... 365/189.09; 365/211; 365/226
(58) Field of Classification Search ............. 365/189.09, 365/211, 226
See application file for complete search history.

(56) References Cited

U.S. PATENT DOCUMENTS

| | | | | |
|---|---|---|---|---|
| 5,673,232 A * | 9/1997 | Furutani | ................... | 365/189.09 |
| 6,292,399 B1 * | 9/2001 | Le et al. | ................... | 365/189.09 |
| 6,424,585 B1 * | 7/2002 | Ooishi | ................... | 365/189.09 |
| 6,456,557 B1 * | 9/2002 | Dadashev et al. | ............ | 365/226 |
| 6,891,764 B2 * | 5/2005 | Li | ................... | 365/189.09 |
| 7,009,882 B2 * | 3/2006 | Chen | ................... | 365/189.09 |
| 7,126,872 B2 * | 10/2006 | Fukui et al. | ................... | 365/189.09 |
| 7,471,584 B2 * | 12/2008 | Egerer | ................... | 365/211 |
| 7,864,599 B2 * | 1/2011 | Chang et al. | ................... | 365/189.09 |

FOREIGN PATENT DOCUMENTS

JP    2005122574 A    5/2005

* cited by examiner

*Primary Examiner* — Trong Phan

(74) *Attorney, Agent, or Firm* — Volentine & Whitt, PLLC (57) ABSTRACT

There is provided a reference potential generating circuit of a semiconductor memory, including: a first MOS transistor group that includes a plurality of first MOS transistors that are connected in series; a second MOS transistor that is connected in series to the first MOS transistor group; a third MOS transistor that is connected in parallel to the circuit in which the first MOS transistor group and the second MOS transistor are connected in series, has a gate connected to a connection point of the first MOS transistor group and the second MOS transistor, and corrects a reference potential from a connection point of the first MOS transistors; and a fourth MOS transistor that is connected to the gate of the third MOS transistor, and decreases the potential of the gate of the third MOS transistor when a permission signal to supply power to the semiconductor memory is input.

4 Claims, 12 Drawing Sheets

| | VCWREF/DC VALUE ≥ TIME NEEDED TO BECOME 95% [ns] | | VCWREF/DC VALUE ≥ TIME NEEDED TO BECOME 98% [ns] | | VCWREF OVERSHOOT (VCWREF max/DC VALUE) | | VOLTAGE CHARACTERISTIC [%]@25°C (VCC = DEVIATION FROM 3.3 V) | | TEMPERATURE CHARACTERISTIC [%]@VCC=3.3V (DEVIATION FROM 25°C) | | REMARK |
|---|---|---|---|---|---|---|---|---|---|---|---|
| | -10°C/3.6V/105°C/2.7V | | -10°C/3.6V/105°C/2.7V | | -10°C/3.6V | 105°C/2.7V | 3.6V | 2.7V | -10°C | 105°C | |
| RELATED ART | 10 | 14 | 11 | 15 | 16.90% | 19.50% | 0.12% | -0.48% | 1.16% | -2.98% | OVER SHOOT AMOUNT IS LARGE |
| INVENTION | 8 | 11 | 8 | 13 | 2.14% | 1.10% | 0.06% | -0.29% | 1.25% | -3.15% | THERE IS NO PROBLEM WITH ACCESS SPEED, TEMPERATURE CHARACTERISTIC, VOLTAGE CHARACTERISTIC AND OVERSHOOT AMOUNT |
| VCW CONVERSION [V] | | | | | 0.058V | 0.030V | 0.002V | -0.008V | 0.034V | -0.085V | |

REFERENCE POTENTIAL GENERATING CIRCUIT OF SEMICONDUCTOR MEMORY

CROSS-REFERENCE TO RELATED APPLICATION

This application is based on and claims priority under 35 USC 119 from Japanese Patent Application No. 2009-076404 filed on Mar. 26, 2009, the disclosure of which is incorporated by reference herein.

BACKGROUND

1. Technical Field

The invention relates to a reference potential generating circuit of a semiconductor memory and more particularly, to a reference potential generating circuit included in an internal power supply circuit mounted in a semiconductor memory.

2. Related Art

In the related art, various technology for suppressing overshoot at the time of supplying power in a voltage generating circuit mounted in a semiconductor integrated circuit have been suggested (for example, Japanese Patent Application Laid-Open (JP-A) No. 2005-122574).

Figure 11:
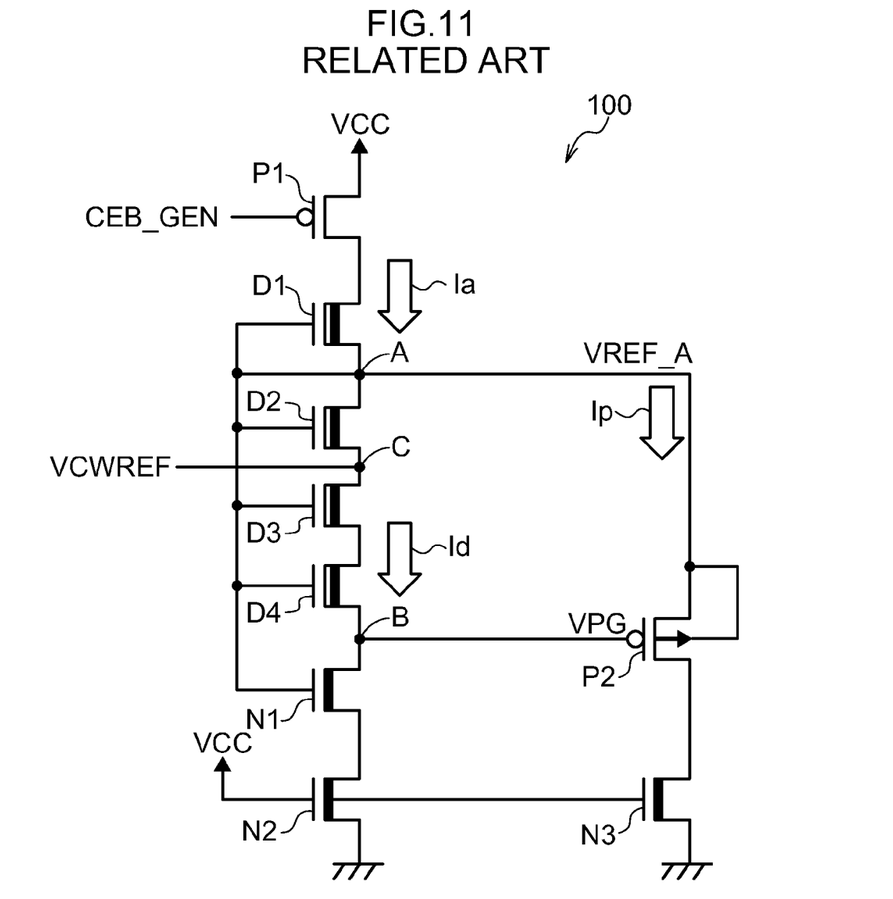
FIG. 11 is a circuit diagram of the reference voltage generating circuit according to the related art.

FIG. 11 illustrates an example of a reference potential generating circuit included in an internal power supply circuit mounted in a ROM functioning as a semiconductor memory.

A reference potential generating circuit 100 illustrated in FIG. 11 has a structure in which a PMOS transistor P2 and an NMOS transistor N3 for reference potential correction are connected in series and this circuit is connected parallel to a circuit in which a PMOS transistor P1, plural DMOS transistors D1 to D4, an NMOS transistor N1 and an NMOS transistor N2 are connected in series. The gate of the PMOS transistor P1 receives an internal power supply enable signal CEB_GEN output by an internal power supply control circuit (not illustrated). The plural DMOS transistors D1 to D4 are for current supply and whose gates are connected to each other. The NMOS transistor N1 is for temperature compensation and whose gate is connected to the gates of the DMOS transistors D1 to D4. The gate of NMOS transistor N2 is applied with a power supply voltage VCC. A reference potential VCWREF is output from a connection point C of the DMOS transistors D2 and D3.

In the reference potential generating circuit 100 having the above configuration, since a variation in the reference potential VCWREF is fed back by the NMOS transistor N1 for temperature compensation, excellent temperature and voltage characteristics may be obtained.

A gate of the PMOS transistor P2 for voltage correction is connected to a connection point B of the DMOS transistor D4 and the NMOS transistor N1, and the power supply voltage VCC is applied to a gate of the NMOS transistor N3.

For example, when the internal power supply enable signal CEB_GEN is at a low level, a mode becomes a normal operation mode. When the internal power supply enable signal CEB_GEN is at a high level, the mode becomes a standby mode.

Figure 12:
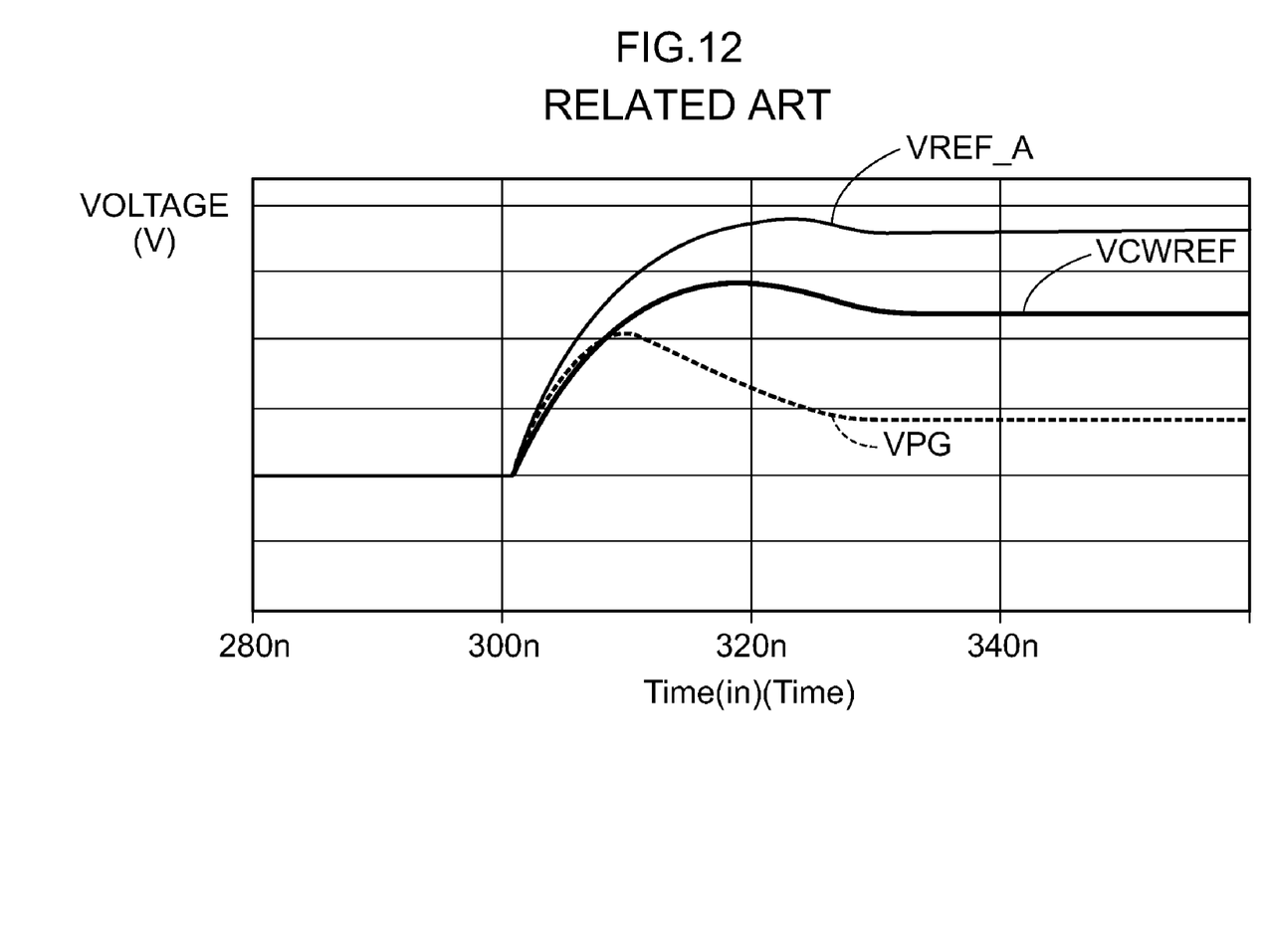
FIG. 12 is a diagram illustrating waveforms of potentials of individual components of the reference voltage generating circuit according to the related art.

In the reference potential generating circuit 100, when a level of the internal power supply enable signal CEB_GEN becomes low and the mode becomes the normal operation mode, in order to start to supply power to an internal circuit by the internal power supply circuit, first, if the PMOS transistor P1 is turned on, a current Ia flows through the DMOS transistor D1 and a current Id flows through the DMOS transistor D4. Thereby, as illustrated in FIG. 12, a voltage VREF_A at a connection point A gradually increases. However, a coupling noise of the voltage VREF_A with respect to a voltage VPG at the connection point B increases, and the voltage VPG increases as the voltage VREF_A increases. As a result, the PMOS transistor P2 for reference potential correction is not turned on and the current Ip does not flow.

Meanwhile, since the current Ia immediately flows through the DMOS transistors D1 to D4 for current supply, the reference potential VCWREF output from the connection point C may overshoot, as illustrated in FIG. 12. This phenomenon becomes notable when resistance generated from the gate of the PMOS transistor P2 for reference potential correction to a ground through the NMOS transistors N1 and N2 for temperature compensation increases.

SUMMARY

Accordingly, it is an object of the invention to provide a reference potential generating circuit of a semiconductor memory that can prevent a reference potential from overshooting at the starting time, without deteriorating temperature and voltage characteristics.

According to an aspect of the invention, there is provided a reference potential generating circuit of a semiconductor memory, including: a first MOS transistor group that includes plural first MOS transistors, which are used for supply of a current to an internal circuit of the semiconductor memory and are connected in series; a second MOS transistor that is connected in series to the first MOS transistor group and are used for temperature compensation; a third MOS transistor that is connected in parallel to the circuit in which the first MOS transistor group and the second MOS transistor are connected in series, has a gate connected to a connection point of the first MOS transistor group and the second MOS transistor, and corrects a reference potential output from a predetermined connection point of the plural first MOS transistors; and a fourth MOS transistor that is connected to the gate of the third MOS transistor, and decreases the potential of the gate of the third MOS transistor when a permission signal to permit the supply of power to the internal circuit of the semiconductor memory is input.

BRIEF DESCRIPTION OF THE DRAWINGS

Exemplary embodiments of the present invention will be described in detail based on the following figures, wherein.

DETAILED DESCRIPTION

Hereinafter, an embodiment of the invention will be described in detail with reference to the drawings.

Figure 1:
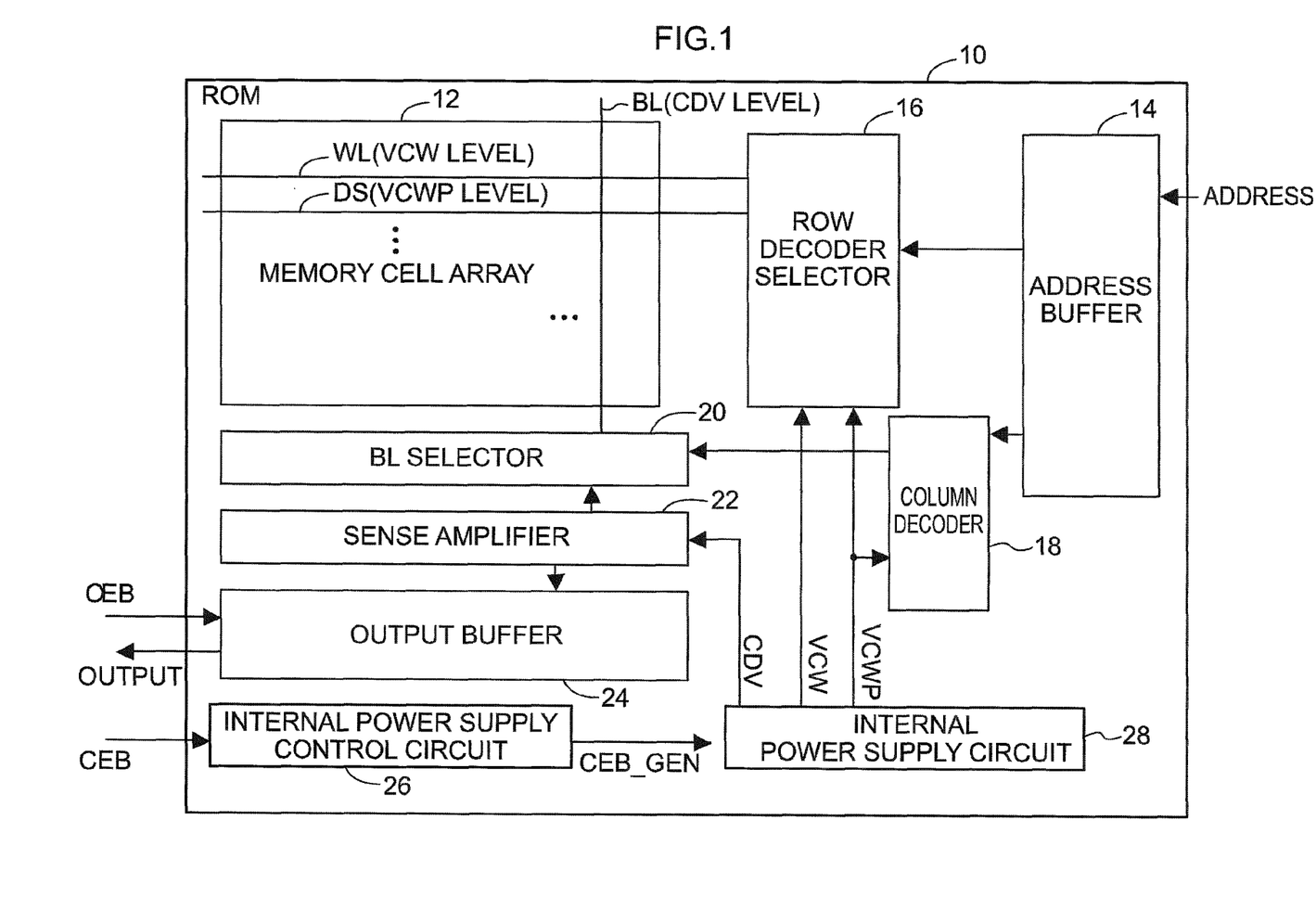
FIG. 1 is a diagram illustrating a schematic configuration of a ROM.

FIG. 1 illustrates the schematic configuration of a ROM 10 that functions as a semiconductor memory according to the embodiment. As illustrated in FIG. 1, the ROM 10 includes a memory cell array 12, an address buffer 14, a row decoder selector 16, a column decoder 18, a BL selector 20, a sense amplifier 22, an output buffer 24, an internal power supply control circuit 26, and an internal power supply circuit 28.

The memory cell array 12 is composed of plural sub-arrays and each sub-array includes plural memory cells.

The address buffer 14 stores an address designated by a control circuit (not illustrated) that controls the ROM 10.

The row decoder selector 16 selects a word line WL and a sub-array selection line DS according to a row address included in the address stored in the address buffer 14, applies a voltage VCW supplied from the internal power supply circuit 28 to the selected word line WL, and applies a voltage VCWP supplied from the internal power supply circuit 28 to the sub-array selection line DS.

The column decoder 18 outputs a column address, which is included in the address stored in the address buffer 14, to a bit line (BL) selector 20.

The BL selector 20 selects a bit line BL according to the column address output from the column decoder 18 and applies a voltage CDV, which is supplied from the internal power supply circuit 28 through the sense amplifier 22, to the selected bit line BL.

The sense amplifier 22 detects a current flowing through a memory cell, which is selected by the word line WL selected by the row decoder selector 16 and the bit line BL selected by the BL selector 20, among memory cells constituting the memory cell array 12, and outputs data corresponding to a determination result of '0' or '1' to the output buffer 24.

The output buffer 24 stores the input data of the memory cell and outputs the stored data, when a level of an output enable signal OEB input from a control circuit (not illustrated) to control the ROM 10 becomes low.

When a level of a chip enable signal CEB input from the control circuit (not illustrated) to control the ROM 10 becomes low, the internal power supply control circuit 26 causes a level of the internal power supply circuit enable signal CEB_GEN to become low, to permit the supply of power from the internal power supply circuit 28 to the internal circuits such as the row decoder selector 16, the column decoder 18, and the sense amplifier 22. As a result, the voltage CDV is supplied from the internal power supply circuit 28 to the sense amplifier 22, the voltage VCW is supplied to the row decoder selector 16, and the voltage VCWP is supplied to the row decoder selector 16 and the column decoder 18.

When the chip enable signal CEB is at a low level, the ROM 10 enters in a normal operation mode. When the chip enable signal CEB is at a high level, the ROM 10 enters in a standby mode.

Figure 2:
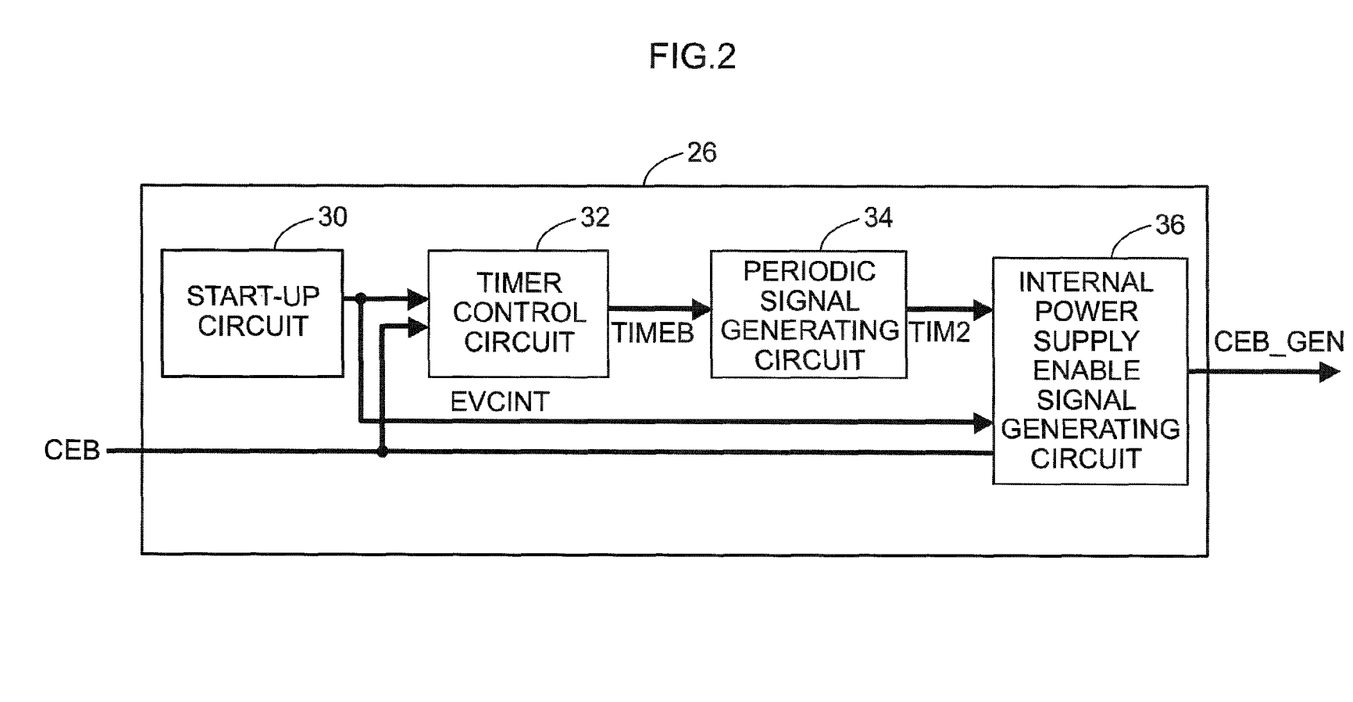
FIG. 2 is a diagram illustrating a schematic configuration of an internal power supply control circuit.

As illustrated in FIG. 2, the internal power supply control circuit 26 includes a start-up circuit 30, a timer control circuit 32, a periodic signal generating circuit 34, and an internal power supply enable signal generating circuit 36.

The start-up circuit 30 outputs a low-level signal during a constant period, when power is supplied, and outputs a signal EVCINT (illustrated in the first graph of FIG. 3), whose level becomes high, to the timer control circuit 32. During a period in which the signal EVCINT is at a low level, since the internal power supply circuit 28 enters in an always-on state, the internal power supply circuit 28 enters in the always-on state during a predetermined period from the supply of the power. This is because various voltages such as the voltage VCWP are increased to a necessary voltage level in a short time.

When the chip enable signal CEB is at a low level, that is, when the mode is the normal operation mode, the timer control circuit 32 always outputs a high-level signal. Only when the level of the chip enable signal CEB becomes high, the mode changes to the standby mode, and the level of the signal EVCINT input from the start-up circuit 30 is high, the timer control circuit 32 outputs a signal TIMEB (illustrated in the second graph of FIG. 3), whose level is switched to a low level, to the periodic signal generating circuit 34.

Figure 3:
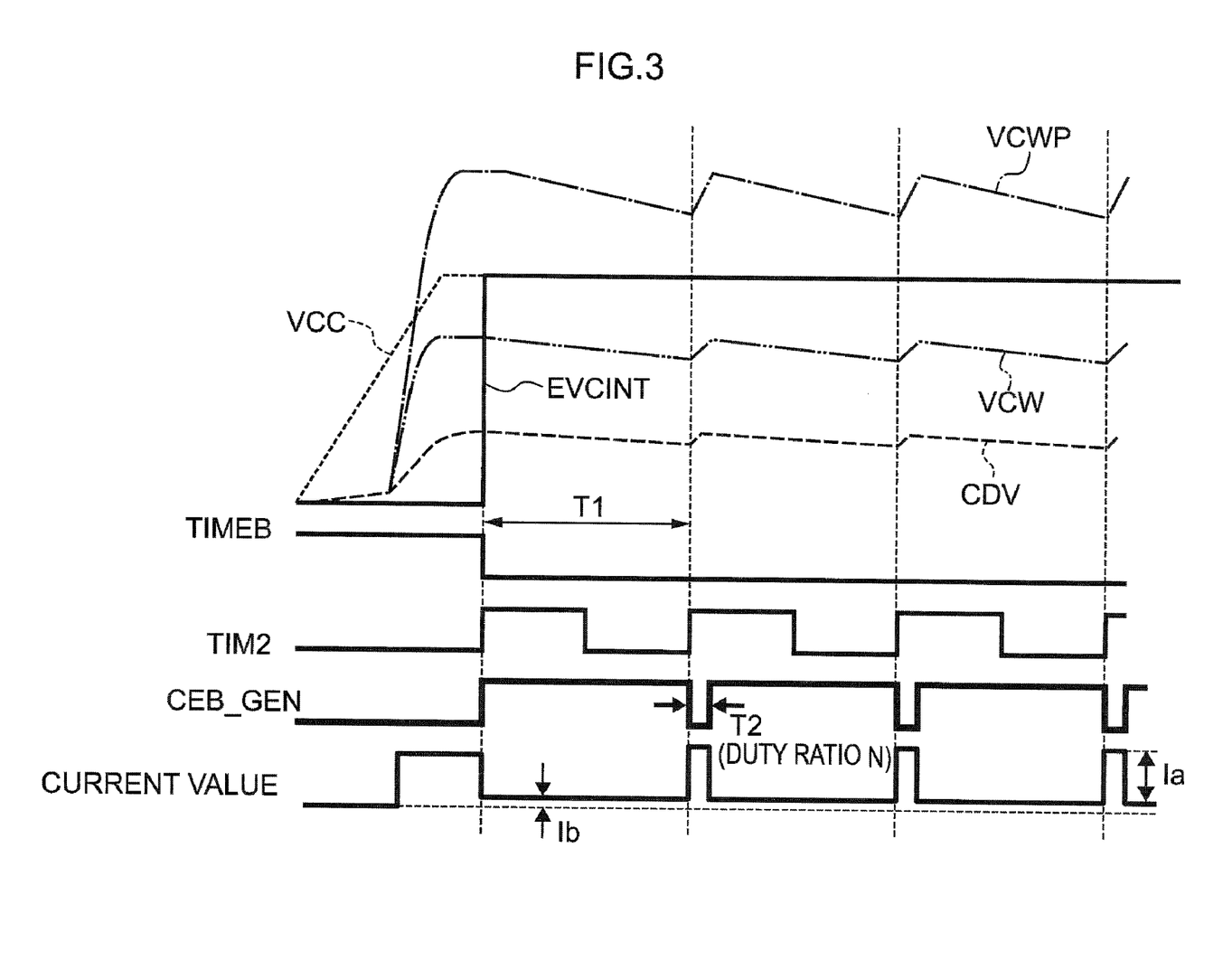
FIG. 3 illustrates waveforms of signals from individual components of the internal power supply control circuit and an internal power supply circuit.

When the level of the signal EVCINT is low, the level of the signal TIMEB becomes high and the periodic signal generating circuit 34 does not operate.

When the level of the signal TIMEB input from the timer control circuit 32 becomes low, the periodic signal generating circuit 34 outputs a periodic signal TIM2, which repeats a high level and a low level with a predetermined period T1 as illustrated in FIG. 3, to the internal power supply enable signal generating circuit 36.

The internal power supply enable signal generating circuit 36 outputs the internal power supply enable signal CEB_GEN whose level becomes low during a predetermined period T2 with a predetermined duty ratio N to the internal power supply circuit 28 in synchronization with a rising edge of a periodic signal TIM2 input from the periodic signal generating circuit 34.

When the chip enable signal CEB is at a low level, the internal power supply enable signal generating circuit 36 always maintains the level of the internal power supply enable signal CEB_GEN at a low level.

Figure 4:
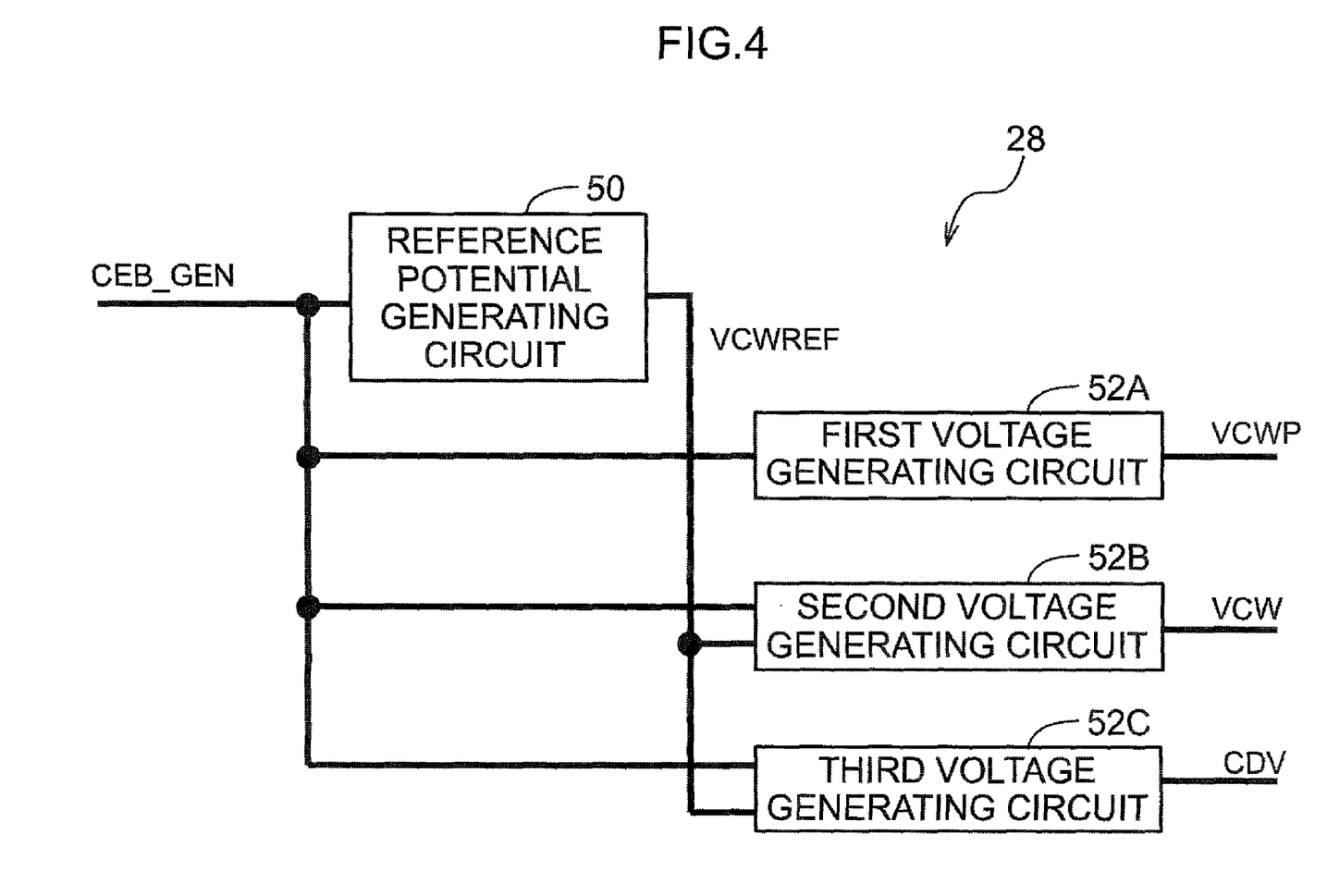
FIG. 4 is a diagram illustrating a schematic configuration of the internal power supply circuit.

As illustrated in FIG. 4, the internal power supply circuit 28 includes a reference potential generating circuit 50, a first voltage generating circuit 52A to generate a voltage VCWP, a second voltage generating circuit 52B to generate a voltage VCW, and a third voltage generating circuit 52C to generate a voltage CDV.

When the level of the internal power supply enable signal CEB_GEN output from the internal power supply enable signal generating circuit 36 becomes low, the reference potential generating circuit 50 generates a reference potential VCWREF and outputs the reference potential VCWREF to the first to third voltage generating circuits 52A to 52C.

The first voltage generating circuit 52A generates the voltage VCWP, based on the input reference potential VCWREF, and outputs the voltage VCWP to the row decoder selector 16 and the column decoder 18.

The second voltage generating circuit 52B generates the voltage VCW, based on the input reference potential VCWREF, and outputs the voltage VCW to the row decoder selector 16.

The third voltage generating circuit 52C generates the voltage CDV, based on the input reference potential VCWREF, and outputs the voltage CDV to the sense amplifier 22.

When the level of the internal power supply enable signal CEB_GEN output from the internal power supply enable signal generating circuit 36 becomes low, the internal power supply circuit 28 supplies power to the individual components in the ROM 10. The graph at the bottom in FIG. 3 illustrates a waveform of a consumption current of the internal power supply circuit 28 in the standby mode.

As such, in the standby mode, the internal power supply enable signal CEB_GEN is a signal that intermittently permits the supply of power from the internal power supply circuit 28. When the internal power supply enable signal CEB_GEN is at a high level, the consumption current of the internal power supply circuit 28 becomes almost zero as shown by Ib in FIG. 3. Thereby, in the standby mode, since the ROM 10 intermittently operates, the voltages VCWP, VCW, and CDV that are output from the internal power supply circuit 28 output the same set values as those in the case of the normal operation during the period T2 where the level of the internal power supply enable signal CEB_GEN becomes low, during the period where the signal TIMEB is at a low level, as illustrated in the second graph of FIG. 3, and gradually decrease during the other period. This operation is repeated.

Therefore, even in the standby mode, the consumption current can be suppressed while a voltage level is maintained at an arbitrary level. As a result, the consumption current of the ROM 10 in the standby mode can be suppressed from a value Ia to a value Ib as shown in FIG. 3. When the mode changes to the normal operation mode, the level of the voltage applied to the individual components of the ROM 10 can be quickly increased to a necessary level, thereby suppressing an access speed from being lowered.

Figure 5:
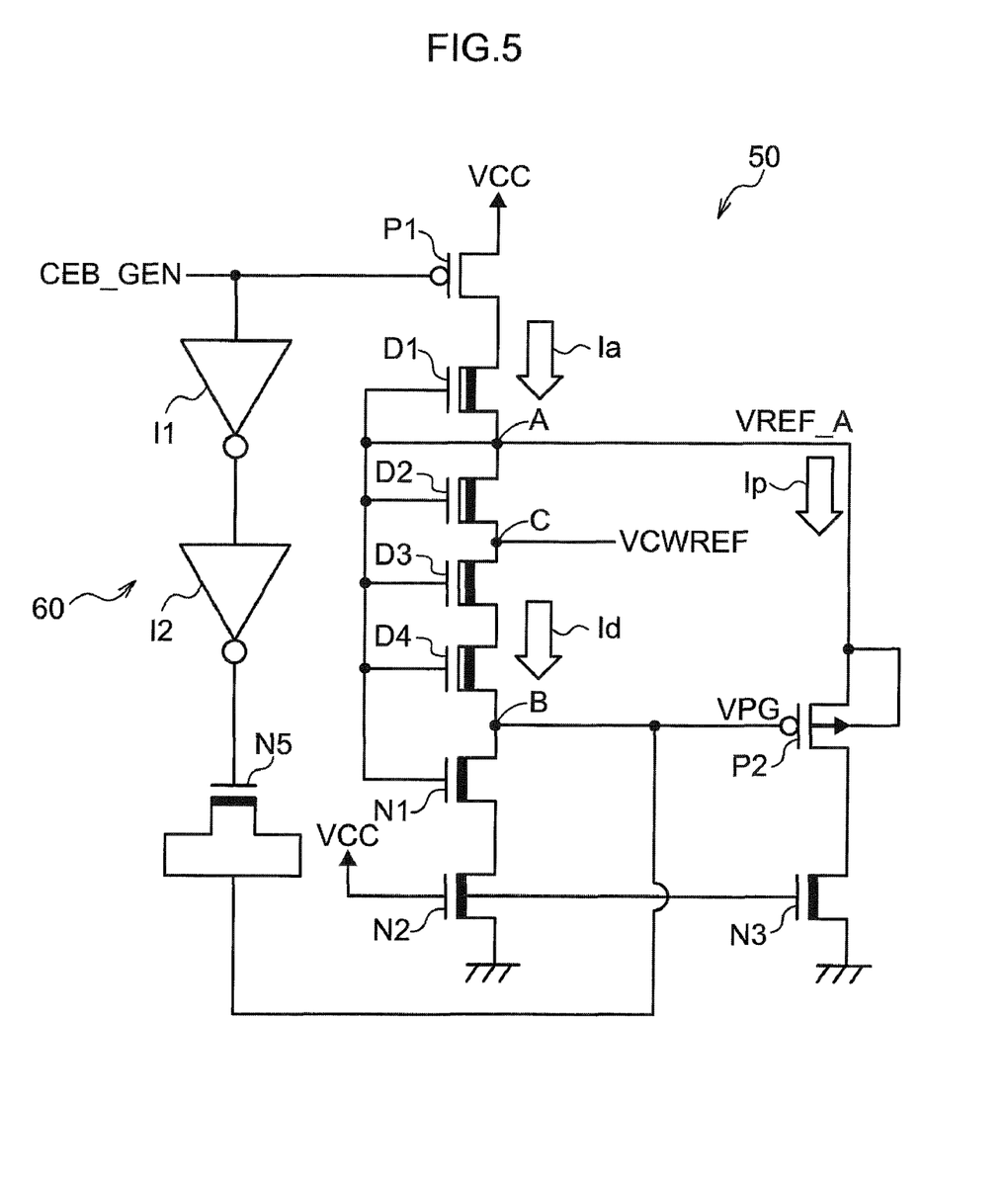
FIG. 5 is a circuit diagram illustrating a reference voltage generating circuit according to an embodiment.

FIG. 5 is a circuit diagram of the reference potential generating circuit 50. In FIG. 5, the same components as those in the reference potential generating circuit 100 illustrated in FIG. 11 are denoted by the same reference numerals and the detailed description thereof is omitted.

As illustrated in FIG. 5, the reference potential generating circuit 50 has a structure in which a coupling noise cancellation circuit 60 to cancel the coupling noise of the voltage VREF_A with respect to the voltage VPG at the connection point B is provided between the gate of the PMOS transistor P1 receiving the internal power supply enable signal CEB_GEN and the gate of the PMOS transistor P2 for reference potential correction. This structure differentiates the reference potential generating circuit 50 illustrated in FIG. 5 from the reference potential generating circuit 100 illustrated in FIG. 11.

The coupling noise cancellation circuit 60 has a structure in which two inverters I1 and I2 and an NMOS transistor N5 are connected in series. An input side of the inverter I1 receives the internal power supply enable signal CEB_GEN. A drain and a source of the NMOS transistor N5 are connected to the gate of the PMOS transistor P2. The NMOS transistor N5 has a function of decreasing the voltage VPG applied to the gate of the PMOS transistor P2 at the starting up time. The number of inverters is not limited to two. For example, the number of inverters may be an even number greater than or equal to four or the inverters may be omitted.

In the reference potential generating circuit 50, when the level of the internal power supply enable signal CEB_GEN becomes low and the mode becomes the normal operation mode, in order to begin supplying power to the internal circuits such as the row decoder selector 16, the column decoder 18, and the sense amplifier 22 by the internal power supply circuit 28, if the PMOS transistor P1 is turned on, the current Ia is made to flow through the DMOS transistor D1 and the current Id is made to flow through the DMOS transistor D4.

Figure 6:
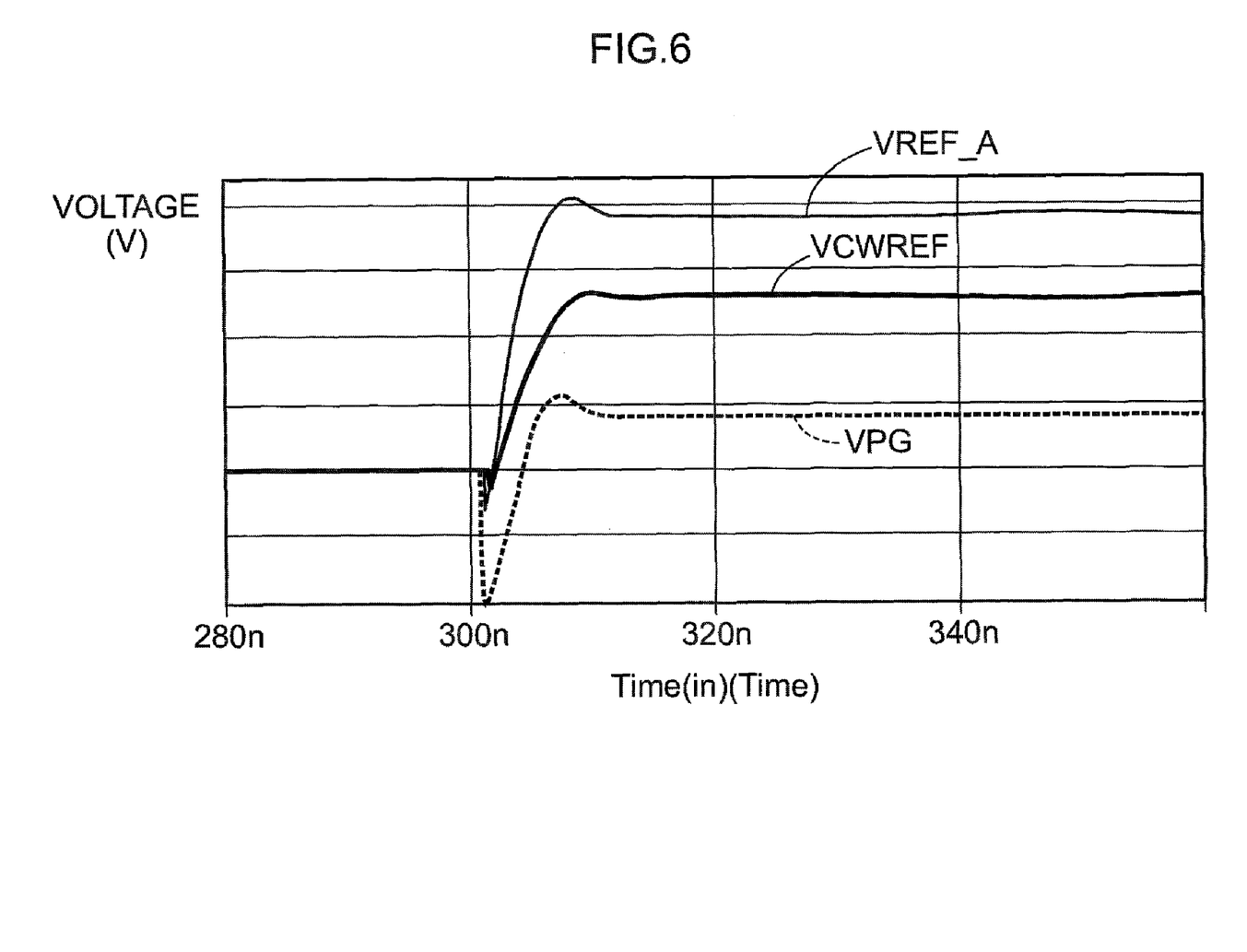
FIG. 6 is a diagram illustrating waveforms of potentials of individual components of the reference voltage generating circuit according to the embodiment.

Accordingly, as illustrated in FIG. 6, the voltage VREF_A at the connection point A gradually increases. However, the coupling noise of the voltage VREF_A with respect to the voltage VPG is canceled by the coupling noise cancellation circuit 60. That is, the coupling noise cancellation circuit 60 generates a cancellation noise to decrease the voltage VPG, at the starting up time. Thereby, since the voltage VPG does not increase as the voltage VREF_A increases, the PMOS transistor P2 for correction is turned on, and the current Ip can be made to flow. For this reason, the reference potential VCWREF can be prevented from overshooting.

Figure 7A:
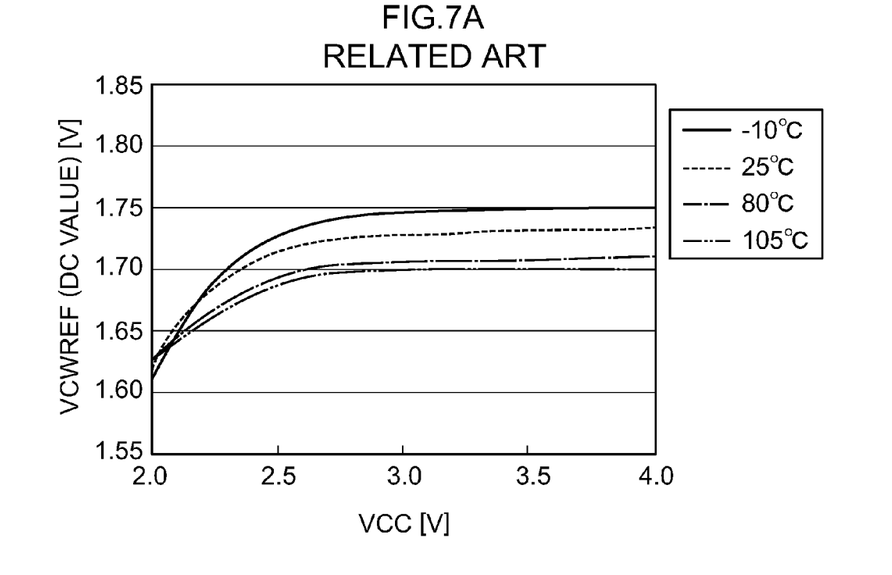
FIG. 7A is a diagram illustrating measurement results of a relationship between a power supply voltage and a reference voltage under plural temperature conditions in a reference voltage generating circuit according to the related art.
Figure 7B:
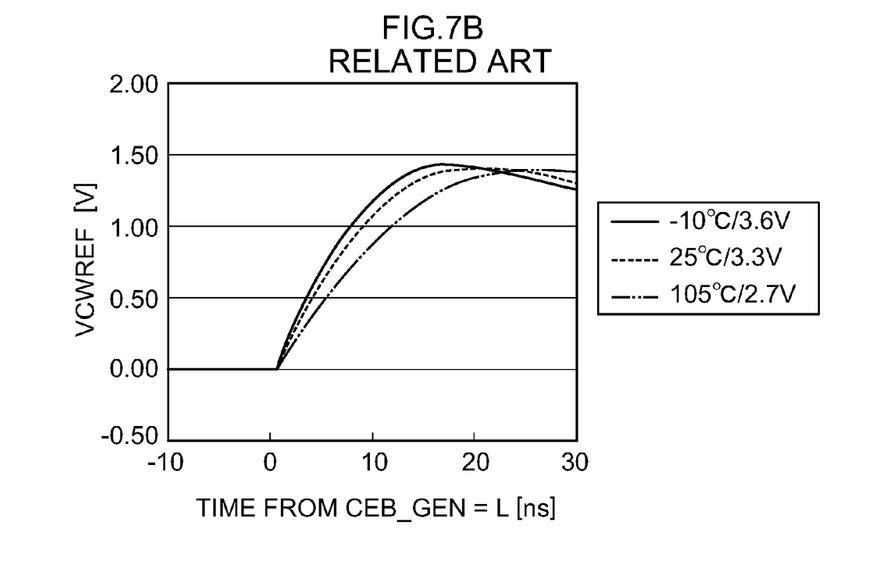
FIG. 7B is a diagram illustrating measurement results of a relationship between a passage time after a level of an internal power supply enable signal becomes low and a reference potential in plural conditions in the reference voltage generating circuit according to the related art.

FIG. 7A illustrates measurement results of a relationship between the power supply voltage VCC and the reference potential VCWREF of the reference potential generating circuit 100 illustrated in FIG. 11, when the temperature is set to −10° C., 25° C., 80° C., and 105° C. FIG. 7B illustrates measurement results of a relationship between the time passed after the level of the internal power supply enable signal CEB_GEN becomes low and the reference potential VCWREF, when the temperature is −10° C. and the power supply voltage VCC is 3.6 V, the temperature is 25° C. and the power supply voltage VCC is 3.3 V, and the temperature is −105° C. and the power supply voltage VCC is 2.7 V.

Figure 8A:
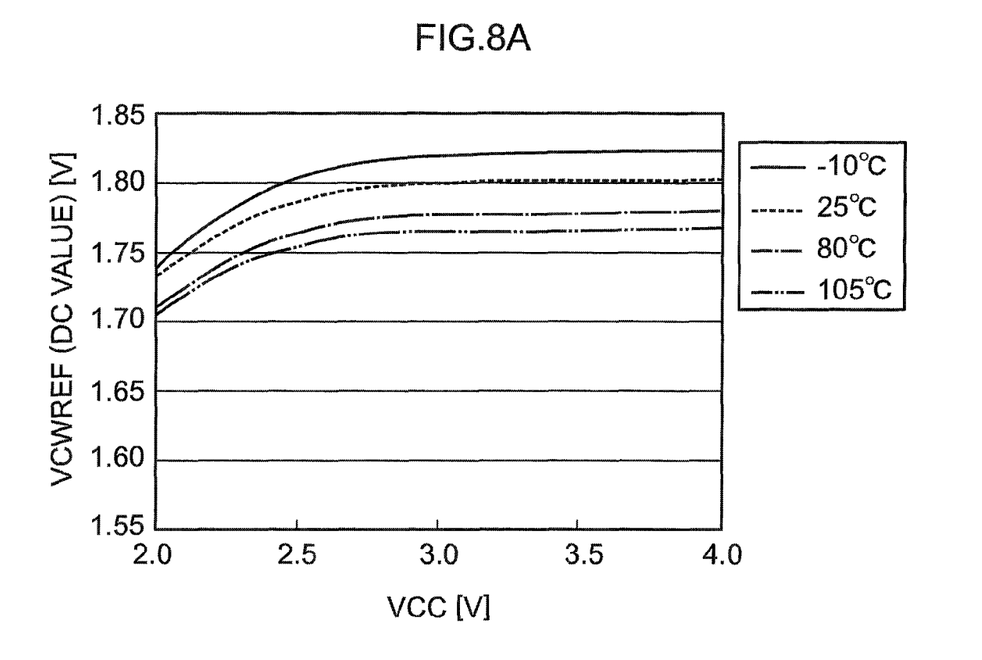
FIG. 8A is a diagram illustrating measurement results of a relationship between a power supply voltage and a reference voltage under plural temperature conditions in the reference voltage generating circuit according to the embodiment.
Figure 8B:
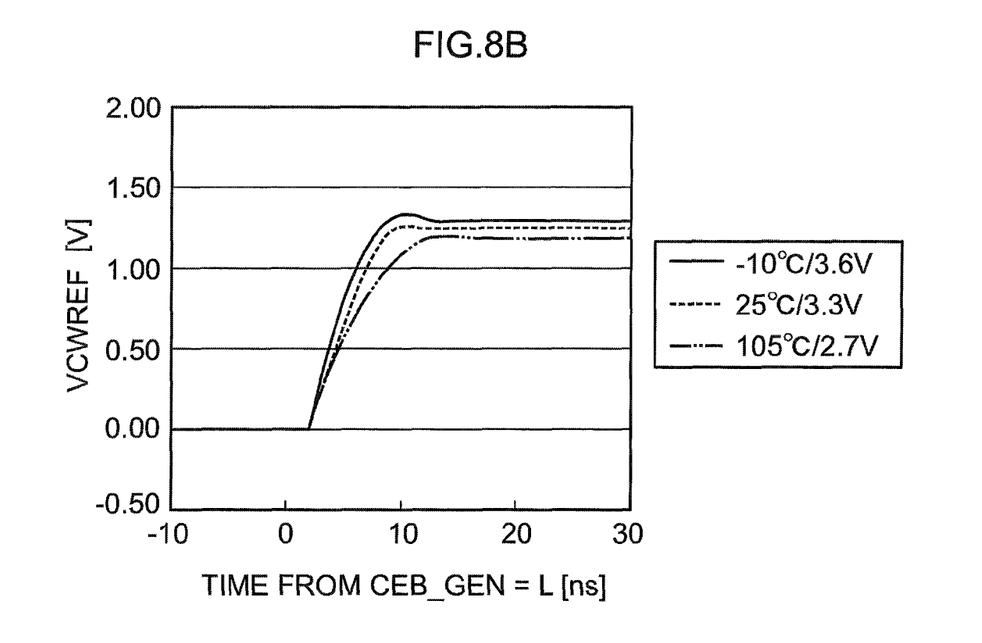
FIG. 8B is a diagram illustrating measurement results of a relationship between a passage time after a level of an internal power supply enable signal becomes low and a reference potential in plural conditions in the reference voltage generating circuit according to the embodiment.

FIG. 8A illustrates measurement results of a relationship between the power supply voltage VCC and the reference potential VCWREF of the reference potential generating circuit 50 according to the embodiment, under the same conditions as those of FIG. 7A. FIG. 8B illustrates measurement results of a relationship between the time passed after the level of the internal power supply enable signal CEB_GEN becomes low and the reference potential VCWREF, under the same conditions as those of FIG. 7B.

Figure 9:
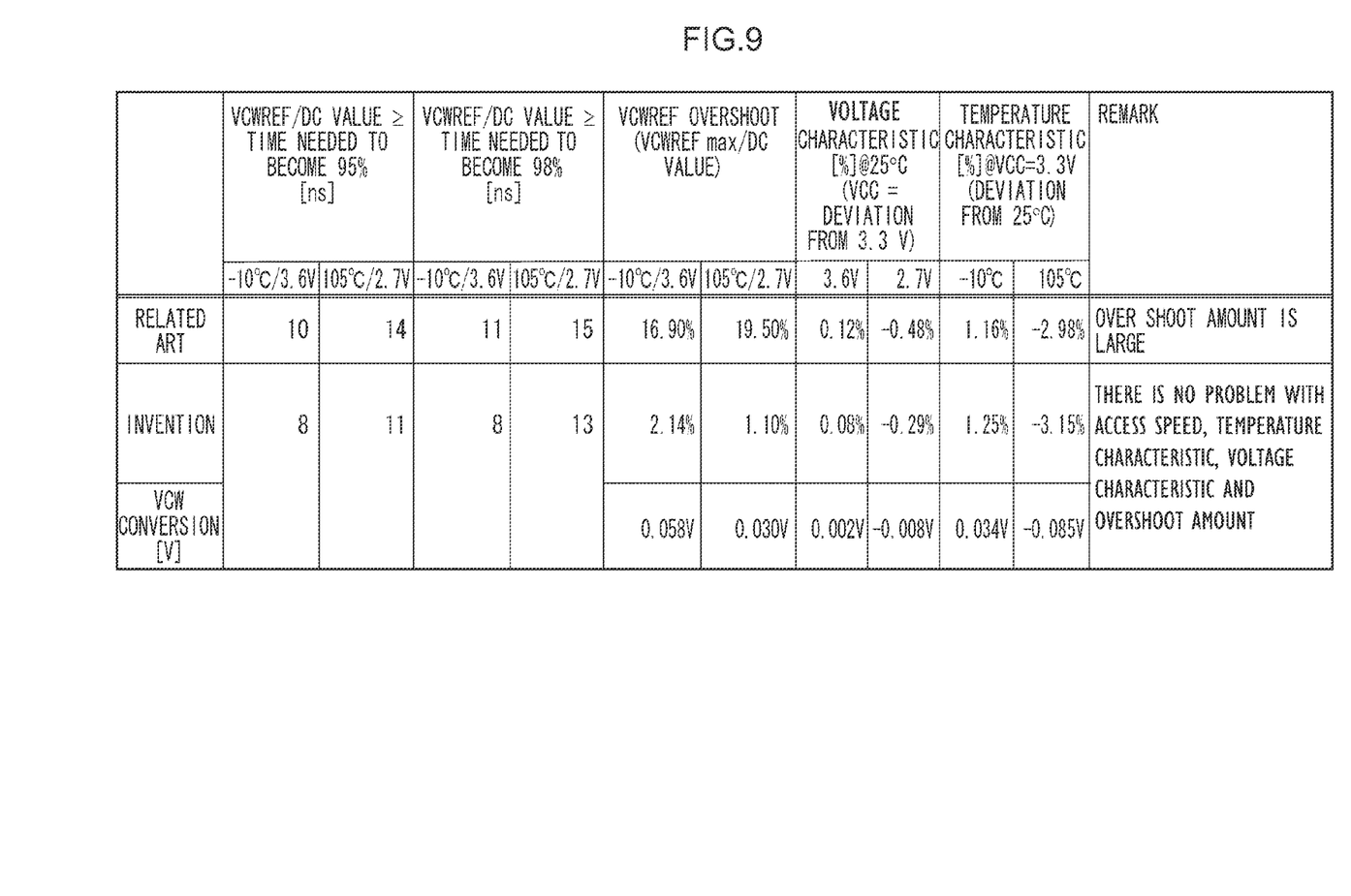
FIG. 9 is a table illustrating a comparison result of characteristics of the reference voltage generating circuit according to the related art and the reference voltage generating circuit according to the embodiment.

FIG. 9 illustrates a calculation result of a time needed in nanoseconds [ns] when a voltage becomes at least 95% of a DC value (voltage where a characteristic becomes constant) of the reference potential VCWREF from the start which is indicated as VCWREF/DC VALUE, a calculation result of a time needed when the voltage becomes at least 98% of the DC value (voltage where a characteristic becomes constant) of the reference potential VCWREF from the start indicated as VCWREF/DC VALUE, and a calculation result of the overshooting amount (maximum value of the reference potential VCWREF/DC value of the reference potential VCWREF) of the reference potential VCWREF which is indicated as VCWREF OVERSHOOT as a percentage [%], each for the case where the temperature is −10° C. and the power supply voltage VCC is 3.6 V (−10° C./3.6V) and the case where the temperature is 105° C. and the power supply voltage VCC is 2.7 V (105° C./2.7V). FIG. 9 further illustrates a calculation result of a voltage characteristic which is indicated as VOLTAGE CHARACTERISTIC illustrated by a difference as a percentage (%) with respect to the reference potential VCWREF when the power supply voltage is 3.3 V, with respect to each of the case where the temperature is 25° C. and the power supply voltage VCC is 3.6 V and the case where the temperature is 25° C. and the power supply voltage VCC is 2.7 V, FIG. 9 also illustrates a calculation result of a temperature characteristic indicated as TEMPERATURE CHARACTERISTIC illustrated by a difference as a percentage (%) with respect to the reference potential VCWREF when the temperature is 25° C., with respect to each of the case where the power supply voltage VCC is 3.3 V and the temperature is −10° C. and the case where the power supply voltage VCC is 3.3 V and the temperature is 105° C., from the measurement results illustrated in FIGS. 7A to 8B, which are calculated with respect to each of the reference potential generating circuit 100 (in related art) and the reference potential generating circuit 50 (in this invention). The measurement results related to the overshooting, the voltage characteristic, and the temperature characteristic in the invention are illustrated together with values converted into the voltage VCW.

As illustrated in FIG. 9, in the reference potential generating circuit 100 according to the related art, the temperature characteristic is excellent, but the rising edge of the potential comes late and the overshooting amount is large as indicated by OVER SHOOT AMOUNT IS LARGE. In contrast to the reference potential generating circuit 100 in the related art, the reference potential generating circuit 50 in the present embodiment has excellent temperature and voltage characteristics, a small overshooting amount, and a fast rising edge of the potential.

Figure 10:
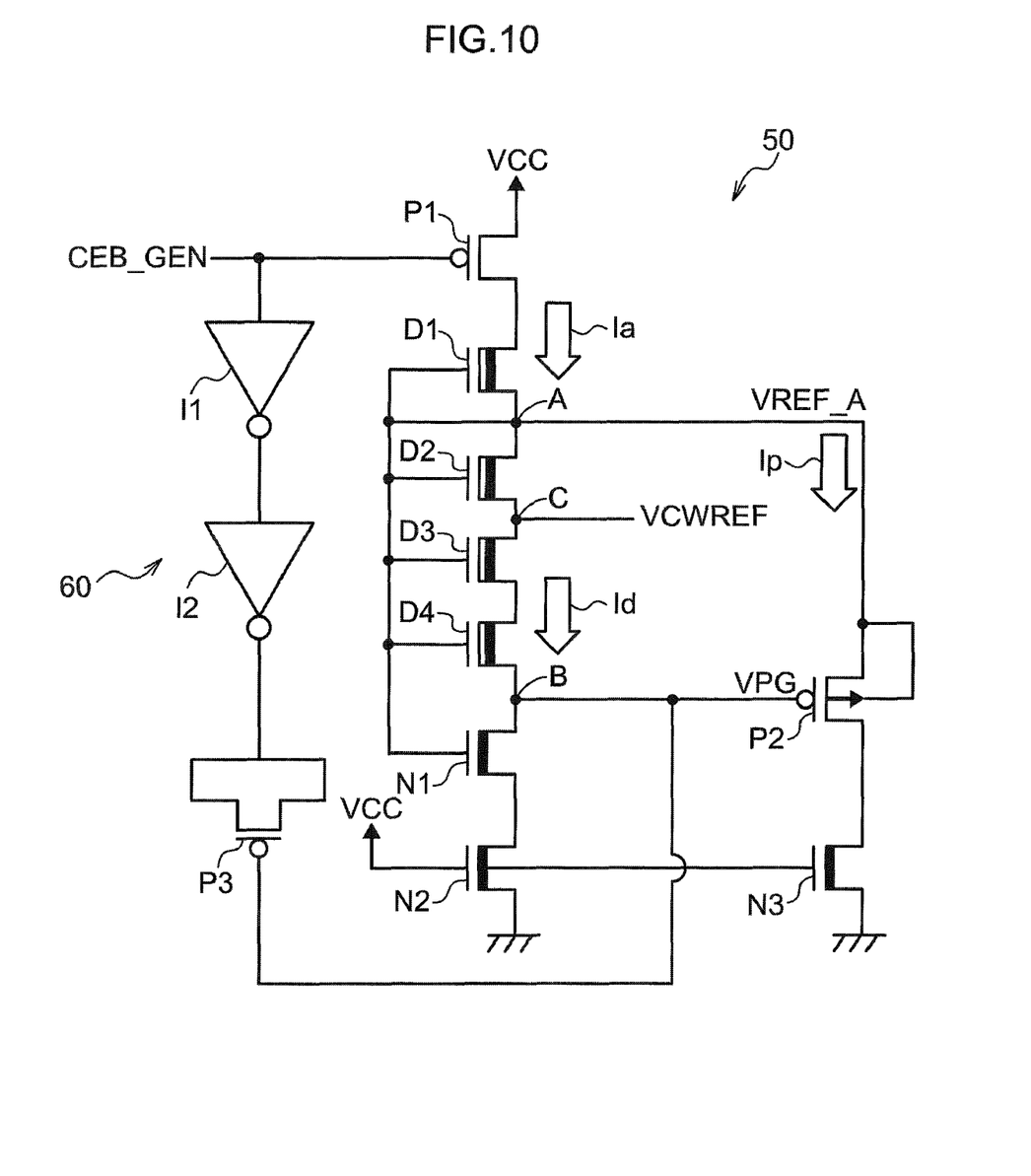
FIG. 10 is a circuit diagram of a reference voltage generating circuit according to a modification of the embodiment.

In the embodiment, the configuration where the NMOS transistor N5 illustrated in FIG. 5 is used as the element to cancel the coupling noise has been described, but the present invention is not limited thereto. For example, as illustrated in FIG. 10, the PMOS transistor P3 may be reversely connected. That is, the gate of the PMOS transistor P3 may be connected to the gate of the PMOS transistor P2 and the drain and the source thereof may be connected to the output side of the inverter I2. Similarly as in FIG. 5, if the PMOS transistor P1 is turned on, the current Ia is made to flow through the DMOS transistor D1 and the current Id is made to flow through the DMOS transistor D4.

In the embodiment, the case where the invention is applied to the ROM functioning as the semiconductor memory has been described, but the present invention can be applied to any semiconductor memory, such as a DRAM, which has an internal power supply.

According to an aspect of the invention, there is provided a reference potential generating circuit of a semiconductor memory, wherein the fourth MOS transistor is an NMOS transistor of which a drain and a source are connected to the gate of the third MOS transistor and a gate receives the permission signal.

According to the invention, the reference potential can be prevented from being overshoot at the time of the start, without deteriorating the temperature and voltage characteristics.

What is claimed is:

1. A reference potential generating circuit of a semiconductor memory, comprising:
   a first MOS transistor group that includes a plurality of first MOS transistors, which are used for supply of current to an internal circuit of the semiconductor memory and are connected in series;
   a second MOS transistor that is connected in series to the first MOS transistor group and is used for temperature compensation;
   a third MOS transistor that is connected to a circuit in which the first MOS transistor group and the second MOS transistor are connected in series, has a gate connected to a connection point of the first MOS transistor group and the second MOS transistor, and corrects a reference potential output from a predetermined connection point of the plurality of first MOS transistors; and
   a fourth MOS transistor that is connected to the gate of the third MOS transistor, and decreases the potential of the gate of the third MOS transistor when a permission signal to permit the supply of current to the internal circuit of the semiconductor memory is input.

2. The reference potential generating circuit of a semiconductor memory of claim 1, wherein the fourth MOS transistor is an NMOS transistor of which a drain and a source are connected to the gate of the third MOS transistor and, of which a gate receives the permission signal.

3. The reference potential generating circuit of a semiconductor memory of claim 1, wherein the fourth MOS transistor is a PMOS transistor of which a gate is connected to the third MOS transistor and, of which a drain and a source receive the permission signal.

4. The reference potential generating circuit of a semiconductor memory of claim 1, wherein inverters of an even number are provided between the fourth MOS transistor and terminals receiving the permission signal.

\* \* \* \* \*